(12) United States Patent
Ku et al.

(10) Patent No.: US 8,816,713 B2
(45) Date of Patent: Aug. 26, 2014

(54) PROBE CARD HAVING ADJUSTABLE HIGH FREQUENCY SIGNAL TRANSMISSION PATH FOR TRANSMISSION OF HIGH FREQUENCY SIGNAL

(75) Inventors: Wei-Cheng Ku, Hsinchu Shien (TW); Chih-Hao Ho, Hsinchu Shien (TW); Chen-Kuo Kao, Hsinchu Shien (TW); Chao-Ping Hsieh, Hsinchu Shien (TW)

(73) Assignee: MPI Corporation, Chu-Pei, Hsinchu Shien (TW)

( * ) Notice: Subject to any disclaimer, the term of this patent is extended or adjusted under 35 U.S.C. 154(b) by 244 days.

(21) Appl. No.: 13/554,528

(22) Filed: Jul. 20, 2012

(65) Prior Publication Data

US 2013/0021053 A1  Jan. 24, 2013

(30) Foreign Application Priority Data

Jul. 22, 2011  (TW) .............................. 100125996 A (51) Int. Cl.
  *G01R 31/00* (2006.01)
  *G01R 1/073* (2006.01)
  *G01R 31/28* (2006.01)
  *G01R 1/06* (2006.01)
  *G01R 1/067* (2006.01)

(52) U.S. Cl.
  CPC ........ *G01R 31/2889* (2013.01); *G01R 1/06772* (2013.01); *G01R 1/073* (2013.01); *G01R 1/067* (2013.01); *G01R 1/06* (2013.01)
  USPC ............. 324/756.03; 324/750.16; 324/755.01

(58) Field of Classification Search
  CPC ........... G01R 31/2889; G01R 1/06772; G01R 1/067; G01R 1/073
  USPC ............ 324/750.16, 750.13, 754.21, 755.01, 324/756.03
  See application file for complete search history.

(56) References Cited

U.S. PATENT DOCUMENTS 7,782,070 B2 *  8/2010  Ku et al. .................... 324/754.1

FOREIGN PATENT DOCUMENTS

| TW | 200537654 | 11/2005 |
| TW | I244169 | 11/2005 |
| TW | I306154 | 2/2009 |
| TW | M361631 | 7/2009 |

* cited by examiner

*Primary Examiner* — Jermele M Hollington
*Assistant Examiner* — Farhana Hoque
(74) *Attorney, Agent, or Firm* — Muncy, Geissler, Olds & Lowe, P.C.

(57) ABSTRACT

A probe card for high-frequency signal transmission includes a circuit board with transmission lines, a plurality of probes, and a signal path adjuster having first lead wires with a same length respectively connected between the transmission lines and the probes. Each first lead wire is selectively replaceable by a second lead having a length different from that of the first lead wire. As a result, a first high-frequency signal transmitting from one transmission line through the associated first lead wire to the associated probe and a second high-frequency signal transmitting from another transmission line through the associated second lead wire to the associated probe may have a same output timing when the first and second high-frequency signals are synchronously inputted into the circuit board.

9 Claims, 11 Drawing Sheets

PROBE CARD HAVING ADJUSTABLE HIGH FREQUENCY SIGNAL TRANSMISSION PATH FOR TRANSMISSION OF HIGH FREQUENCY SIGNAL

BACKGROUND OF THE INVENTION

1. Field of the Invention

The present invention relates to probe cards for high-frequency test signal transmission for testing electronic devices of a semiconductor wafer and more particularly, to a probe card having adjustable high-frequency signal transmission paths for enabling output of synchronous high-frequency test signals from a tester to devices under test.

2. Description of the Related Art

As electronic products become increasingly high-speed operation and integration of processing functions, semiconductor wafers are mostly formed of digital chip circuits for high-speed and high-frequency applications. Therefore, single-chip circuits tend to have multiple sets of circuit inputs. After through internal multiplex and synchronous processing, you can make the output of a single chip circuit be integrated with the functional requirements of a variety of electronic products. When a probe card probes high-speed processed digital chip circuits in a wafer-level testing, the probe card is used as a space transformer between the tester and the chip circuits. The transmission frequency of the test signals in the probe card not only must match the operating frequency of the chip circuits, it also must to let multiple input pins of the chip circuits to synchronously receive the test signals, avoiding signal output distortion to affect test quality due to delay of some input signals.

Taiwan Patent Publication No. 200537654 disclosed a semiconductor package design entitled "High Electric Performance semiconductor Device". In this design, the package uses packaging components to serve as space transformer for the pins of the chip circuits. This design also faces the synchronization and integrity of signal transmission of chip circuit signals. When it is necessary to conduct the pins of chip circuits having a relatively fine pitch to package contacts having a relatively larger pitch, the unequal lengths of bond wires will result in the drawback of differential signal inconsistence. Although this patent teaches the arrangement of same length lead wires to let the pins of the chip circuits be electrically connected to the package contacts through the lead wires by means of a wire bonding structure having approximately the same length. However, there are also unavoidable mechanical errors in the control of wire bonding.

In the fabrication of a probe card for wafer-level testing, even all module structures of the probe card have been configured into a consistent transmission structure subject to the defined high frequency characteristics, differences of high frequency signal receiving timing in the module structures may still occur after the module structures have been assembled because high frequency signals are highly sensitive to environments of transmission structures. For example, in a probe card for testing wafers of 300 mm, each single transmission line extends from the periphery of the probe card to one respective probe at the center. A minor total signal path difference between different transmission lines, for example, 1 mm, will cause a time difference of several tens of picoseconds between the received high frequency signals in high frequency chip circuits operated in Giga Hertz. Installation errors of different transmission paths of a probe card may be unable to output signals to chip circuits synchronously. Therefore, most commercial probe cards cannot actually meet high frequency test conditions for chip circuits, constraining wafer test engineering to limited high frequency bandwidths. If the probe card circuit is completely laid on the circuit board within the board structure, of course, the length of all transmission lines can be precisely controlled during the integrated circuit layout process; however, it can only be applied to test a specific wafer. After module engineering, the specifically designed probe card can simply allow sintering repair for short circuits and broken circuits, and is difficult or not permitted to adjust signal transmission synchronization.

Taiwan Patent No. M361631 disclosed a probe card design, entitled "Cantilever Probe Card". According to this design, this cantilever probe card is a probe card module structure of the assembly of external circuits and a standard printed circuit board for probe card. It provides an added flexible circuit board, and signal contacts at two opposite ends of the flexible circuit board. By means of cutting the flexible circuit board, the wire length can be adjusted subject to the location of any signal contact. However, in a high frequency signal transmission structure using, for example, high frequency transmission lines or signal transmission lines of differential signal pairs, test signals are almost completely transmitted through the transmission wire materials in and/or around the probe card to the probes at the center of the probe card. After module engineering, the lengths of the transmission lines can simply be adjusted using a mechanical cutting method. However, to a transmission line structure having the characteristics of low impedance and large diameter, the precision of micro adjustment using a mechanical cutting method may have an error about 1 mm. Therefore, in actual practice, conventional probe cards for high frequency test signal application are all limited by probe card module fabrication errors, unable to overcome the problem of signal asynchronization during transmission of high frequency signals through the probe cards to chip circuits.

SUMMARY OF THE INVENTION

The present invention has been accomplished under the circumstances in view. It is the primary objective of the present invention to provide a probe card for high frequency signal transmission, which has a signal path adjuster that can compensate the process error generated during the fabrication of any modularized production of the probe card for synchronously outputting the high frequency test signals from a tester to devices under test, thereby effectively improving the high frequency transmission bandwidth in wafer-level testing.

To achieve this objective, a probe card for high frequency signal transmission provided by the present invention comprises a circuit board on which a plurality of transmission lines are arranged, a probe set having a plurality of probes, and a signal path adjuster having a plurality of lead wires each having two ends. The lead wires comprises first lead wires having a same first length, and second lead wires each having a length different from that of the first lead wires. The first lead wires are respectively electrically connected between the transmission lines and the probes. Each first lead wire is selectively replaceable by a second lead wire, such that a first high frequency signal transmitting from one transmission line through the associated first lead wire to the associated probe and a second high frequency signal transmitting from another transmission line through the associated second lead wire to the associated probe have a same output timing when the first and second high frequency signals are synchronously inputted into the circuit board. By means of substituting a second lead wire for a first lead wire to adjust the length of the high frequency signal path, the process error generated during the fabrication of any modularized production of the probe card or the displacement error of the junction between two different module structures can be compensated, such that the asynchronous output problem between high frequency signals due to the process errors can be compensated, resulting in that that the high frequency signals finally transmitted to the probes can be synchronously outputted to the IC chips of the wafer under test.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
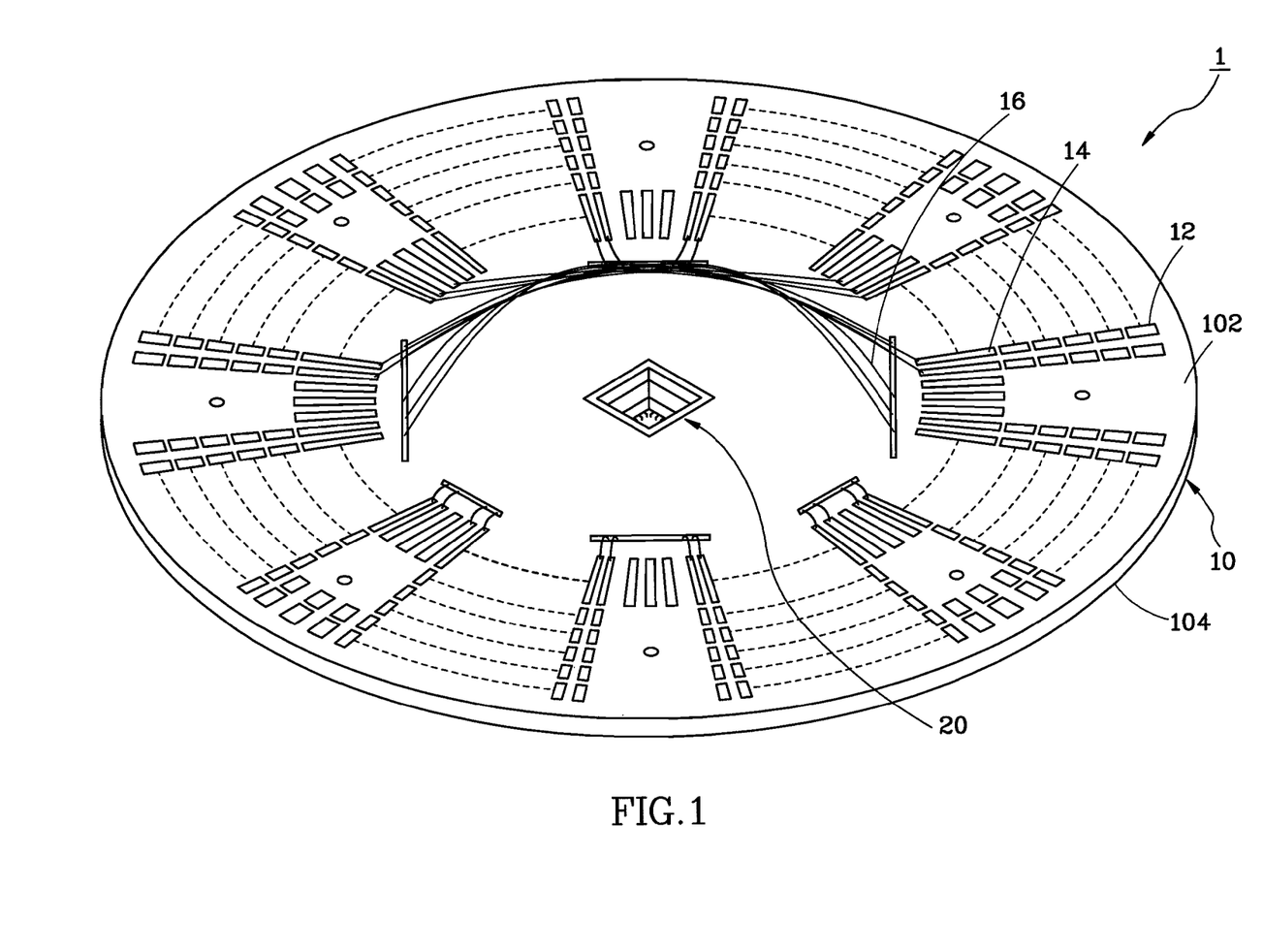
FIG. 1 is a schematic perspective view of a probe card in accordance with a first embodiment of the invention, viewed from a top side of the probe card.
Figure 2:
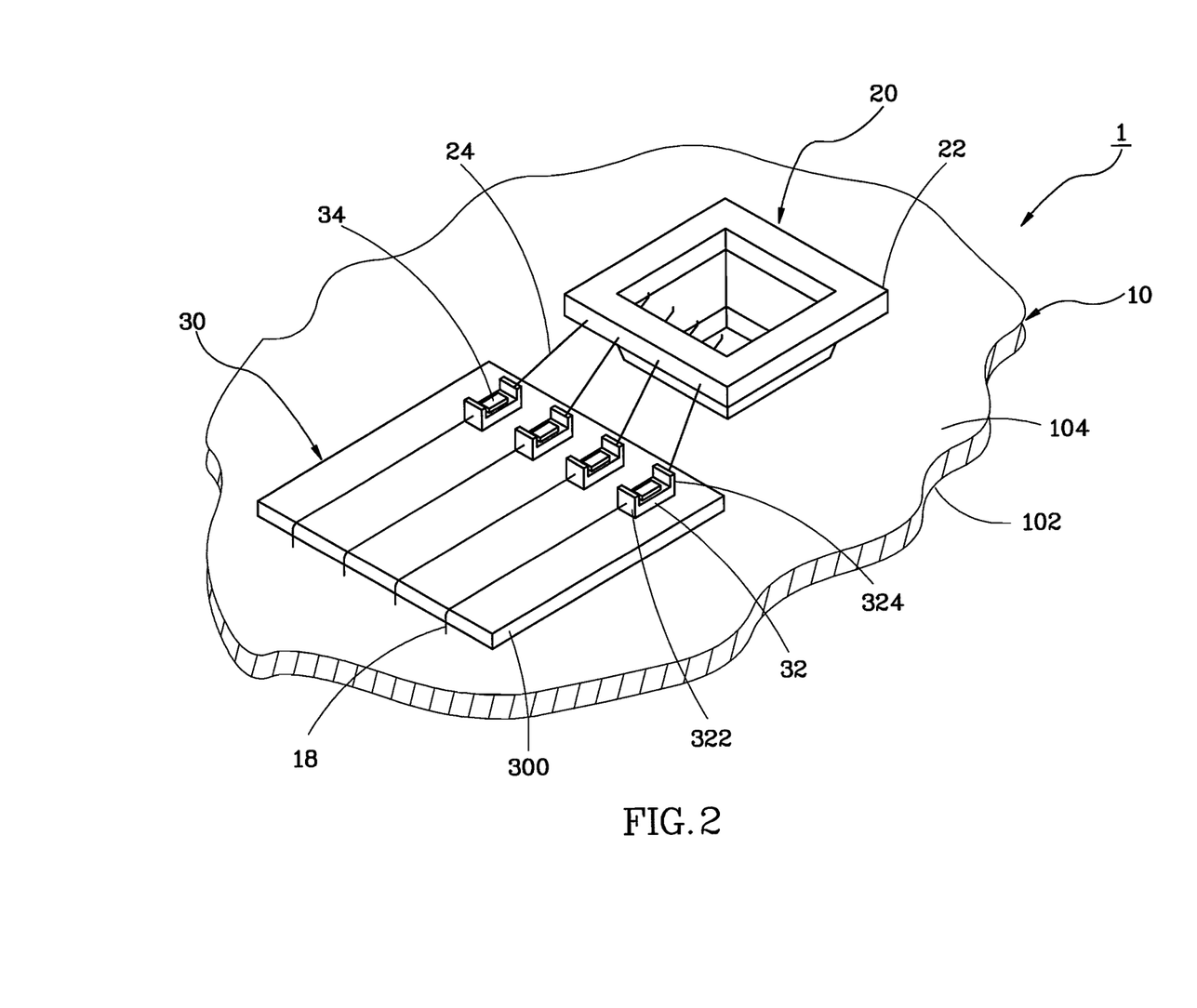
FIG. 2 is another perspective view, in an enlarged scale, of a part of the probe card of the first embodiment of the present invention, viewed from a bottom side of the probe card.

Referring to FIGS. 1 and 2, a probe card 1 having a signal path adjustment function in accordance with a first embodiment of the invention is shown. The probe card 1 is adapted to receive synchronous high frequency test signals from a tester and then synchronously output these high frequency test signals to the IC chips of a wafer under test for measuring the electrical characteristics of the wafer under test. The probe card 1 comprises a circuit board 10, a probe set 20, and a signal path adjuster 30.

The circuit board 10 has a top surface 102 and a bottom surface 104 opposite to the top surface 102. The probe set 20 is mounted at the center of the circuit board 20. The circuit board 10 further comprises a plurality of test contacts 12 located on the top surface 102 for the contact of the pogo pins of the aforesaid tester electrically, a plurality of circuit contacts 14 located on the top surface 102, a plurality of transmission circuits (not shown) extending along the top surface 102 or embedded in the inside of the circuit board 10 to electrically connecting the respective circuit contacts 14 to the respective test contacts 12, a plurality of second transmission lines 18 arranged at the bottom surface 104 and electrically connected to the signal path adjuster 30, as shown in FIG. 2, and a plurality of first transmission lines 16 selectively disposed adjacent to or connected with the circuit contacts 14 and respectively terminating in or electrically connected to the second transmission lines 18. Thus, high frequency test signals received from the tester can be transmitted through the first transmission lines 16 and the second transmission lines 18 to the signal path adjuster 30 and then the probe set 20. It is worth mentioning that the arrangement of the first transmission lines 16 and the second transmission lines 18 at the top surface 102 and bottom surface 104 of the circuit board 10 is subject to the cantilever probe structure of the arrangement of the probe set 20 at the bottom side of the circuit board 10. In the case of a different probe structure, for example, a vertical probe card or Micro-electro-mechanical systems (MEMS) probe card design is used as a probing device to contact the IC chips of the wafer under test, the arrangement of the terminal ends of the probes at the circuit board for electrically connecting to the signal path adjuster should be relatively changed. This probe end adjustment technology is obvious to any person skilled in the art, and therefore, it is within the application range of the present invention.

The probe set 20 is mounted to the center of the bottom surface 104 of the circuit board 10, comprising a hollow probe holder 22 and a plurality of probes 24. Each probe 24 has its front tip suspending in the hollow probe holder 22, and its rear end electrically connected to the signal path adjuster 30. In this embodiment, the probes 24 are directly installed in the signal path adjuster 30. Thus, high frequency test signals to be synchronously received by the IC chips of the wafer under test, when passing through the signal path adjuster 30, can be directly transmitted to the probes 24, lowering return loss through different media interfaces.

The signal path adjuster 30 comprises a substrate 300 fixedly mounted at the bottom surface 104 of the circuit board 10, a plurality of adapters 32 mounted at the substrate 300, and a microcircuit board 34 detachably mounted in each adapter 32 in a replaceable manner. The second transmission lines 18 at the circuit board 10 of the probe card 1 extend to the substrate 300 and are respectively electrically connected with the adapters 32. The microcircuit board 34 in each adapter 32 is formed with a lead wire matching the impedance of the associated transmission line 18, having two ends thereof respectively electrically connected to two connection portions 322, 324 of the associated adapter 32. The two connection portions 322, 324 of each adapter 32 are respectively electrically connected with one respective second transmission line 18 and one respective probe 24 of the probe set 20. The lead wires of the microcircuit boards 34 include first lead wires of a same first length, and second lead wires that have a length different from that of the first lead wires. The second lead wires may have different lengths and two or more second lead wires may have a same second length. When the tester synchronously input first and second high frequency test signals to the circuit board 10, the first high frequency test signal goes through one first transmission line 16 and one associated second transmission line 18 to one associated first lead wire of the signal path adjuster 30 and then one associated probe 24, and the second high frequency test signal goes through another first transmission line 16 and associated second transmission line 18 to one associated second lead wire of the signal path adjuster 30 and then associated probe 24. When outputted through the probe set 20, these two high frequency test signals may have the same output timing. The microcircuit boards 34 can be made using micro-electro-mechanical systems (MEMS), printed circuit board (PCB), multi-layer organic (MLO), multi-layer ceramic (MLC) or thin film manufacturing technology, enabling high frequency test signals transmitting through the microcircuit boards 34 to have the characteristic of matching the impedance of the associated transmission line 18. During fabrication of the microcircuit boards 34, the lead wires of the microcircuit boards 34 are configured to be a first lead wire, or a second lead wire having a different length relative to the first lead wire. It is worth mentioning that the arrangement of the adapters 32 can be variously embodied, facilitating quick replacement and positioning of the microcircuit boards 34 in the signal path adjuster. Any other measure that enables the microcircuit boards 34 to be electrically connected with the respective first transmission lines 16 and second transmission lines 18 to meet the characteristics required for the high frequency signal path adjuster can be adopted. For example, the microcircuit boards 34 can be separately provided and then secured to the substrate 300 of the signal path adjuster 30 with cover means.

Further, the transmission lines 16, 18 in accordance with the present invention can be coaxial transmission lines, or signal pairs of parallel conducting wires disclosed in Taiwan Patent No. 1306154, which have the functional structure of high frequency characteristics of impedance matching. Thus, high frequency signals transmitting through the transmission lines 16, 18 and the microcircuit boards 34 of the signal path adjuster 30 are high frequency transmission signals with the grounding potential. Further, the probes 24 provided by the present invention can be individual metal needles, coaxial transmission lines, or two parallel conducting wires so that high frequency signals transmitting through the transmission lines 16, 18 and the signal path adjuster 30 to the probes 24 before going out of the front tips of the probes 24 can be high frequency transmission signals accompanied with the grounding potential.

Figure 3:
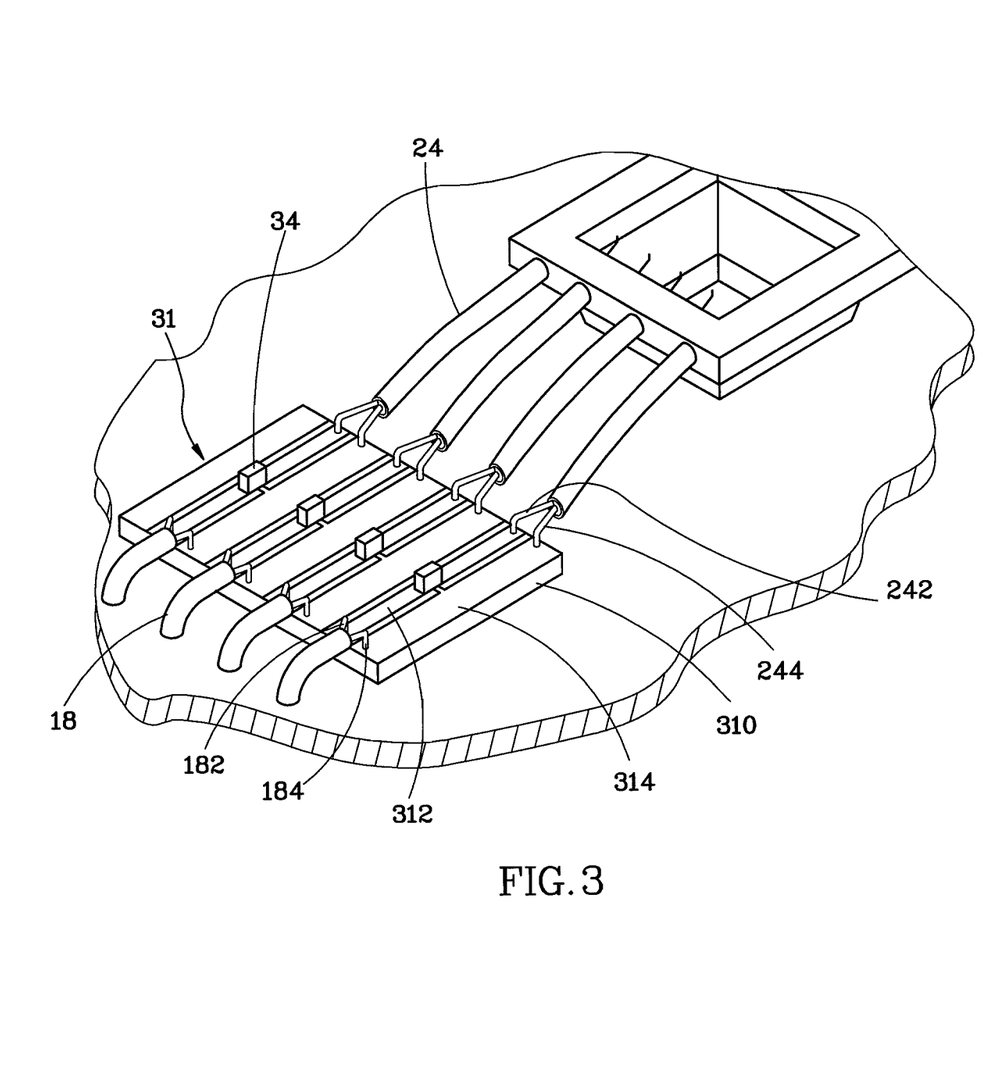
FIG. 3 is similar to FIG. 2, but illustrating alternate forms of the signal path adjuster, the transmission lines and the probes.

In the above-described example of the first embodiment of the present invention, the electrical connection between the transmission lines 18 and probes 24 and the microcircuit boards 34 is achieved by means of the adapters 32. In another example of the first embodiment of the present invention, as shown in FIG. 3, the signal path adjuster, denoted by reference numeral 31, eliminates the aforesaid adapters 32. As illustrated, the signal path adjuster 31 is electrically connected with coaxial transmission lines 18 and probes 24, comprising a substrate 310 and a plurality of microcircuit boards 34 directly mounted on the substrate 310. Each microcircuit board 34 is electrically connected with a signal lead wire 312 and a grounding lead wire 314 that are arranged on the substrate 310 adjacent to the respective microcircuit board 34 in a parallel manner. The signal lead wires 312 on the substrate 310 have the same length, each having two ends respectively and electrically connected to a core 182 of one respective transmission line 18 and a core 242 of one respective probe 24. Each ground lead wire 314 has two ends respectively and electrically connected to a grounding wire 184 of one respective transmission line 18 and a grounding wire 244 of one respective probe 24. Further, it is to be noted that the parallel arrangement of each signal lead wire 312 and the mating ground lead wire 314 is not limited to one same plane, i.e., they can be arranged in parallel in a horizontal or vertical manner, or in any parallel manner with a fixed pitch defined therebetween.

The probe card 1 is operated subject to the following high frequency signal path adjustment method provided by the present invention, enabling the two synchronously inputted high frequency signals to be synchronously outputted through the probe set 20, and therefore two high frequency test signals transmitted through two different high frequency transmission paths may have the same output timing.

The high frequency signal path adjustment method comprises the steps of:

a) preparing a plurality of lead wires, for example, the lead wires arranged on each of the aforesaid microcircuit board 34;

b) recording the different lengths of the lead wires;

c) arranging a plurality of first lead wires, which have the same length and selected from the prepared lead wires, on a signal path adjuster, for example, the signal path adjuster 30 of the aforesaid probe card 1;

d) using a circuit board to synchronously receive a plurality of high frequency signals, for example, using the test contacts 12 of the circuit board 10 of the aforesaid probe card 1 to receive high frequency signals;

e) enabling the high frequency signals to be transmitted through the circuit board and the signal path adjuster and then outputted through a probe set, for example, the probes 20 of the probe set 24 of the aforesaid probe card 1, to IC chips under test;

f) detecting the signal characteristics of the high frequency signals outputted from the probe set, and monitoring whether or not the output timings of the outputted high frequency signals are synchronous;

g) comparing an output timing difference between two aforesaid outputted high frequency signals respectively passing two said first lead wires in step f) with an output timing difference between two high frequency signals synchronously and respectively inputted into and then respectively outputted from one of the first lead wires recorded in step b) and any one of the second lead wires recorded in step b) to find out the output timing difference between the high frequency signals respectively outputted from the first lead wire recorded in step b) and the target one of the second lead wires recorded in step b) that is mostly close to the output timing difference between the two aforesaid outputted high frequency signals in step f);

h) substituting the target one of the second lead wires recorded in step b) for the first lead wire through which one of the two aforesaid outputted high frequency signals that are compared in step g) passes. In the step h), if the length of the target second lead wire is smaller than that of the first lead wire, the target second lead wire substitutes for the one of the two said first lead wires having a delayed output timing of the outputted high frequency signal in step f). On the contrary, if the length of the target second lead wire is greater than that of the first lead wire, the target second lead wire substitutes for the one of two said first lead wires having an ahead output timing of the outputted high frequency signal in step f).

In conclusion, the high frequency signal path adjustment method and the probe card can compensate the process error during the fabrication of any modularized production of the probe card, or the displacement error of the junction between two different module structures. For example, in the fabrication of the aforesaid probe card 1, the transmission line structure between the test contacts 12 and circuit contacts 14 of the circuit board 10, the transmission lines 16 and 18 and the probes 24 of the probe set 20, or the junction between the circuit contacts 14 and the first transmission lines 16 and the junction between the first transmission lines 16 and the second transmission lines 18, the allowable tolerance of any specification of the probe card 1 may produce additive overall error after probe card 1 is assembled. By means of the aforesaid signal path adjustment method and the probe card, the asynchronous output problem between high frequency signals due to the process errors can be compensated, so that the high frequency signals finally transmitted to the probes 24 can be synchronously outputted to the IC chips of the wafer under test.

Figure 4:
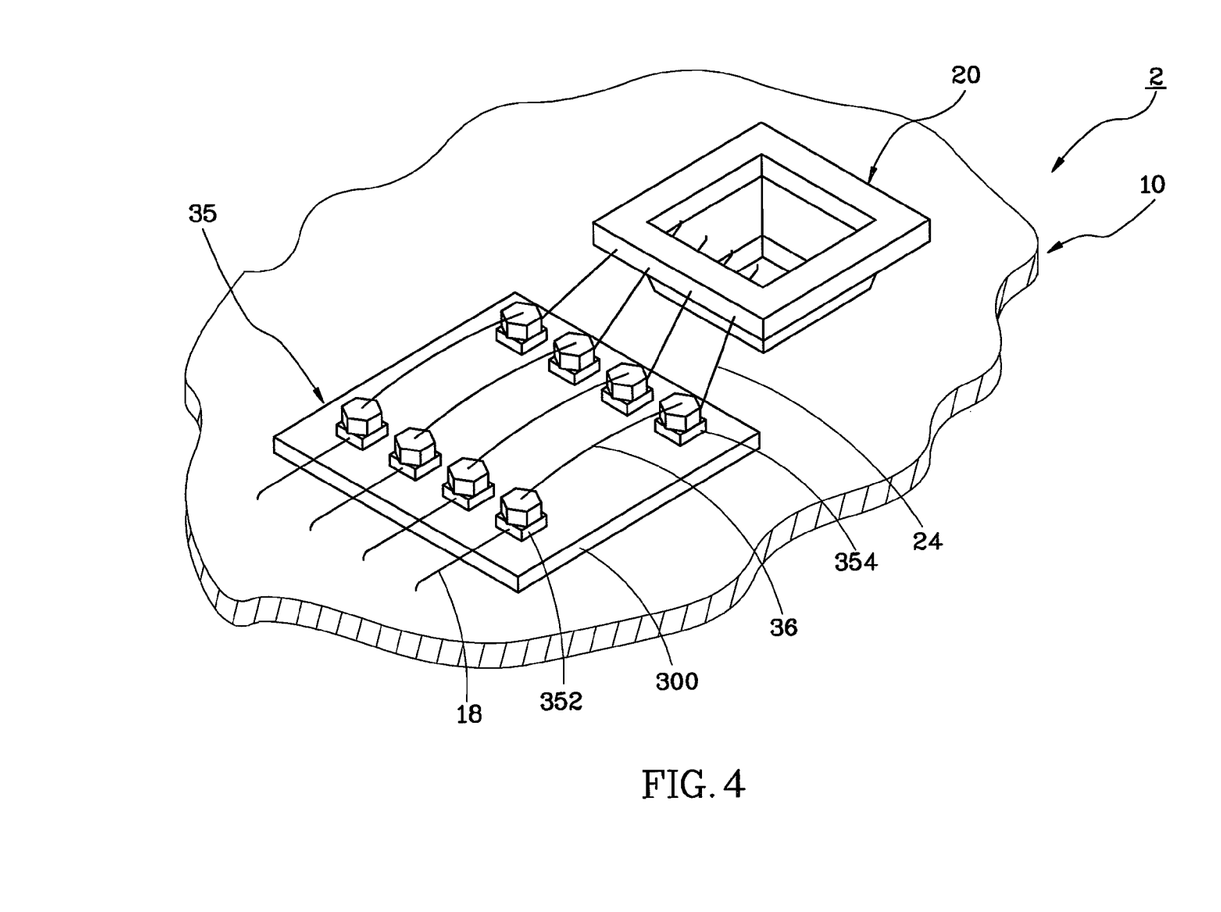
FIG. 4 is a perspective view of a part of a probe card in accordance with a second embodiment of the present invention, viewed from a bottom side of the probe card.

FIG. 4 illustrates a probe card 2 having a signal path adjustment function in accordance with a second embodiment of the present invention. Similar to the aforesaid first embodiment, the probe card 2 of this second embodiment uses the same circuit board 10 and the same probe set 20; however, the signal path adjuster, denoted by reference numeral 35, in this second embodiment uses coaxial transmission lines for the lead wires.

As illustrated, the signal path adjuster 35 comprises a substrate 300, two sets of connectors 352, 354 arranged at the substrate 300 and respectively electrically connected to the transmission lines 18 of the circuit board 10 and the probes 24 of the probe set 20, a plurality of lead wires 36 formed of coaxial transmission lines and arranged on the substrate 300 with respective opposing ends thereof electrically and detachably connected between the two sets of connectors 352, 354 in a pluggable/depluggable manner. The lead wires 36 are classified into first lead wires having one same length, and the reminders served as the second lead wires. When the tester synchronously inputs two high frequency signals into the circuit board 10, one high frequency signal goes through one said first transmission line 16, one said second transmission 18 and one first lead wire of the signal path adjuster 35 to one said probe 24, and the other high frequency signal goes through another said first transmission line 16, another said second transmission 18 and one second lead wire of the signal path adjuster 35 to another said probe 24, thus, the two high frequency signals may have the same output timing when they are outputted from the probe set 20.

Figure 5:
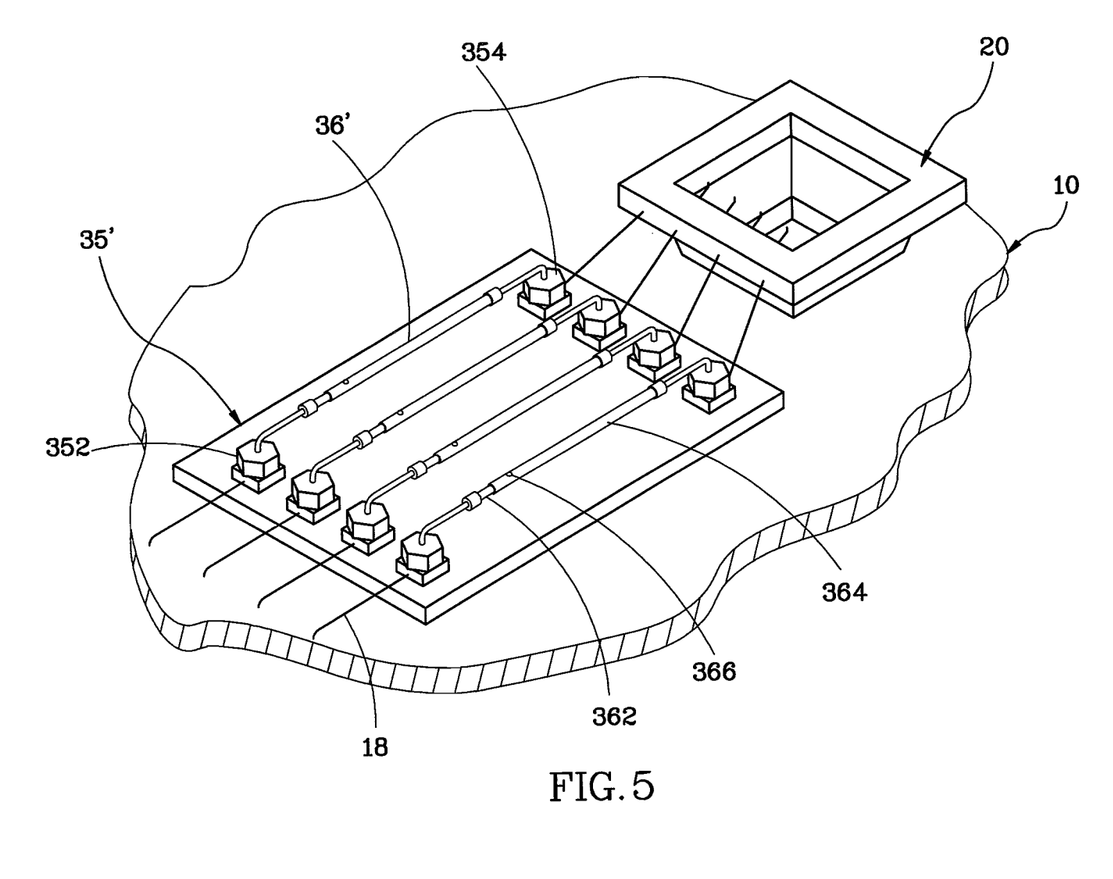
FIG. 5 is similar to FIG. 4, but illustrating an alternate form of the signal path adjuster.
Figure 6:
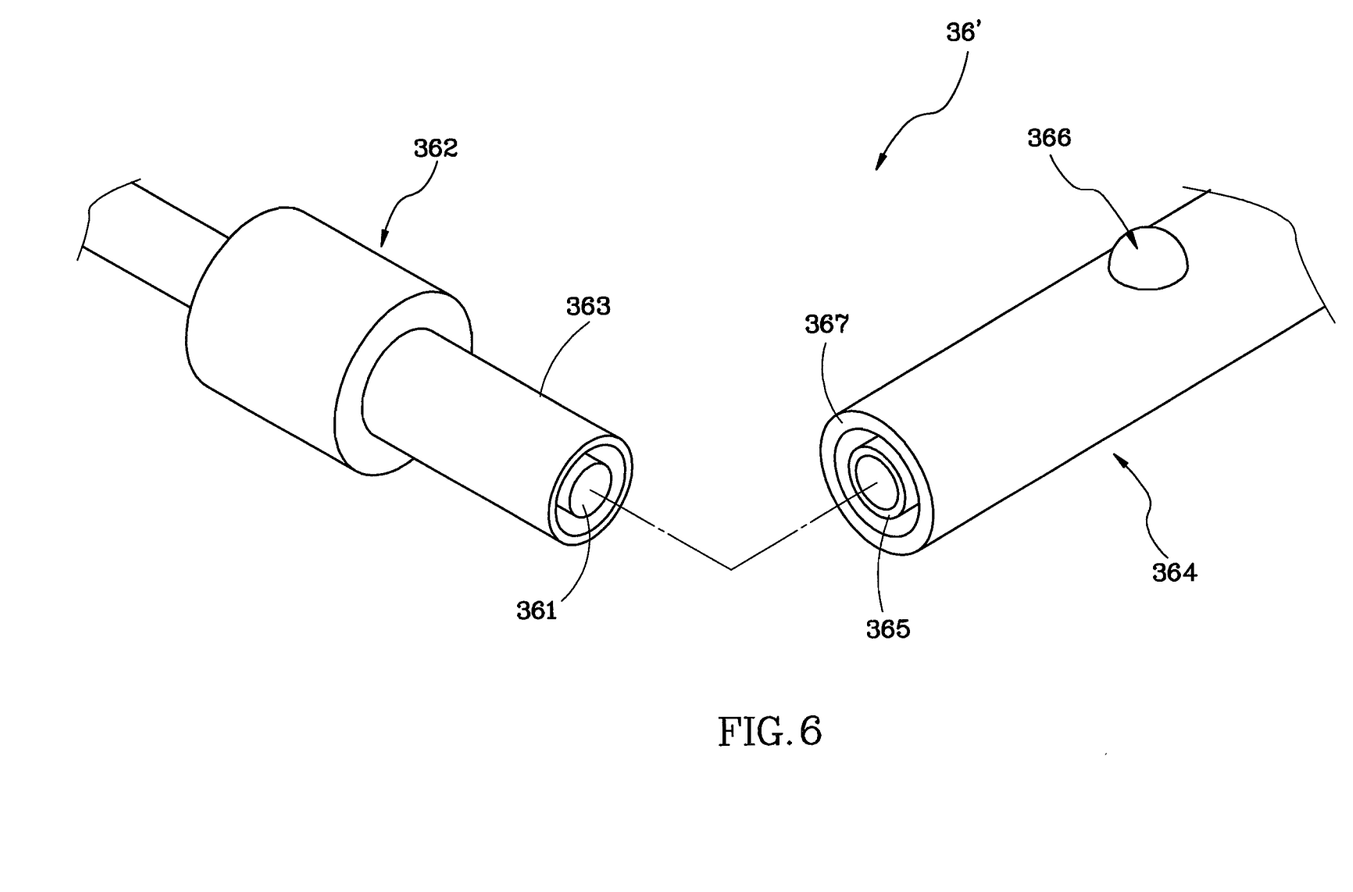
FIG. 6 is an exploded view in an enlarged scale of one length-adjustable combination lead wire shown in FIG. 5.

Of course, the connection between the coaxial transmission lines and the two sets of connectors of the signal path adjuster is not limited to the aforesaid pluggable/depluggable manner. In an alternate form of the signal path adjuster 35' shown in FIG. 5, length-adjustable combination lead wires 36' are used to substitute for the aforesaid fixed lead wires 36. Each length-adjustable combination lead wire 36' comprises a first adjustment segment 362, a second adjustment segment 364, and a fixed contact 366. As illustrated in FIG. 6, the first adjustment segment 362 and the second adjustment segment 364 each comprise a transmission portion 361, 365 and a grounding portion 363, 367 arranged in a coaxial manner. The transmission portion 361 and grounding portion 363 of the first adjustment segment 362 have the respective diameters respectively smaller than that of the transmission portion 365 and grounding portion 367 of the second adjustment segment 364 so that the transmission portion 361 and grounding portion 363 of the first adjustment segment 362 are respectively axially insertable into the transmission portion 365 and grounding portion 367 of the second adjustment segment 364. In this embodiment, the transmission portion 361 of the first adjustment segment 362 is a solid structure insertable into the hollow structure of the transmission portion 365 of the second adjustment segment 364 to keep the periphery of the grounding portion 363 of the first adjustment segment 362 in close contact with the inside wall of the grounding portion 367 of the second adjustment segment 364. After insertion of the first adjustment segment 362 into the second adjustment segment 364 to the extent where the combined length of the first adjustment segment 362 into the second adjustment segment 364 is equal to the length of the desired first lead wire or second lead wire, the fixed contact 366 is pressed to join the grounding portions 363, 367 of the first adjustment segment 362 and second adjustment segment 364. The interval between the transmission portion 361 and grounding portion 363 of the first adjustment segment 362 and the interval between the transmission portion 365 and grounding portion 367 of the second adjustment segment 364 are so designed that during transmission of high frequency signals, the high frequency signal passing through the unreconstructed first adjustment segment 362 or second adjustment segment 364 and the high frequency signal passing the reconstructed overlapping part exhibit signal characteristic impedance matching, maintaining the signal characteristic impedance of the high frequency signal passing through the lead wire 36'.

Figure 7:
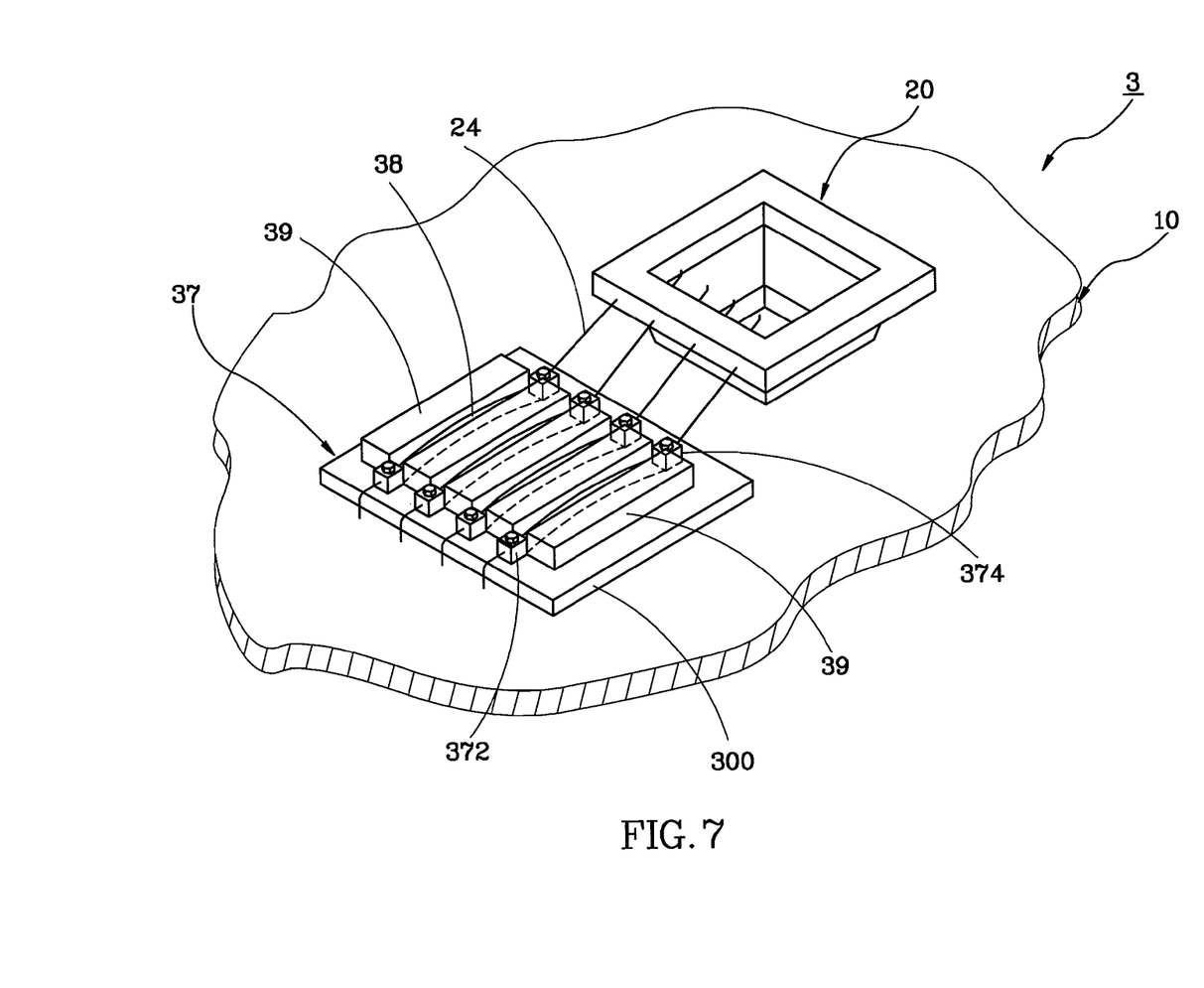
FIG. 7 is a perspective view of a part of a probe card in accordance with a third embodiment of the present invention, viewed from a bottom side of the probe card.

FIG. 7 illustrates a probe card 3 having a signal path adjustment function in accordance with a third embodiment of the present invention. Similar to the aforesaid first embodiment, the probe card 3 of this third embodiment uses the same circuit board 10 and the same probe set 20; however, the signal path adjuster, denoted by reference numeral 37, in this third embodiment uses single-core wire materials having high-frequency transmission line characteristics for the lead wires.

As illustrated, the signal path adjuster 37 comprises a substrate 300, a plurality of elongated metal blocks 39 fixedly arranged in parallel on the substrate 300, a channel defined between each two adjacent elongated metal blocks 39, two sets of electric connectors 372, 374 respectively located on the substrate 300 at the two distal ends of each of the channels, a plurality of single-core lead wires 38 respectively set in the channel between each two adjacent elongated metal blocks 39 in a fixed pitch manner and respectively electrically connected with the respective two opposite ends thereof to the two sets of electric connectors 372, 374. The channels have a depth (height) greater than the diameter of the single-core lead wires 38. Thus, even the length of the single-core lead wires 38 is greater than the length of the channels, the single-core lead wires 38 can be curved in the respective channels without protruding over the height of the respective channels.

The elongated metal blocks 39 are conducted to the grounding potential of the circuit board 10. The two sets of electric connectors 372, 374 are respectively electrically connected to the transmission lines 18 of the circuit board 10 and the probes 24 of the probe set 20. Thus, keeping the single-core lead wires 38 in proximity to the adjacent grounded elongated metal blocks 39 enables the high frequency signals transmitting through the single-core lead wires 38 of the signal path adjuster 37 to be equal to that transmitting through high frequency transmission lines. These single-core lead wires 38 can be insulation shielded single-core metal wires. Alternatively, these single-core lead wires 38 can be non-insulated metal wires in cooperation with surface insulated elongated metal blocks for enabling the transmission of high frequency signals through the signal path adjuster 37 to have the same result as being transmitted through high frequency transmission lines. Among these single-core lead wires 38, the ones that have one same length are defined as first lead wires, and the others that may have different lengths thereamong, each of which is different from that of the first lead wires, are defined as second lead wires. When the aforesaid tester synchronously input two high frequency signals to the circuit board 10, one high frequency signal will be transmitted through one first transmission line 16 and one respective second transmission line 18 to one first lead wire of the signal path adjuster 37 and then one said probe 24, and the other high frequency signal will be transmitted another first transmission line 16 and the corresponding second transmission line 18 to one second lead wire of the signal path adjuster 37 and then another said probe 24. When the two high frequency signals are outputted through the probe set 20, they may have the same output timing.

Figure 8:
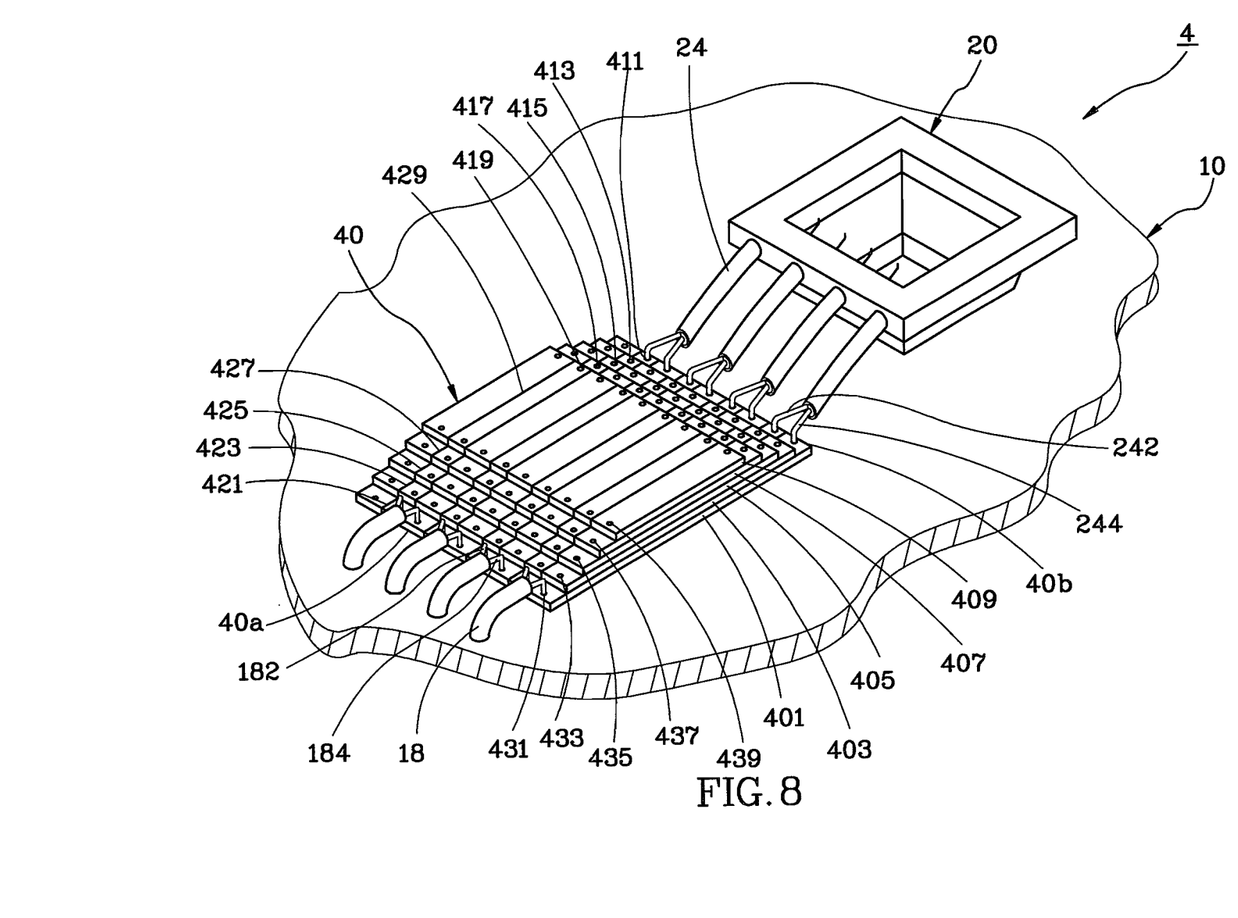
FIG. 8 is a perspective view of a part of a probe card in accordance with a fourth embodiment of the present invention, viewed from a bottom side of the probe card.
Figure 9:
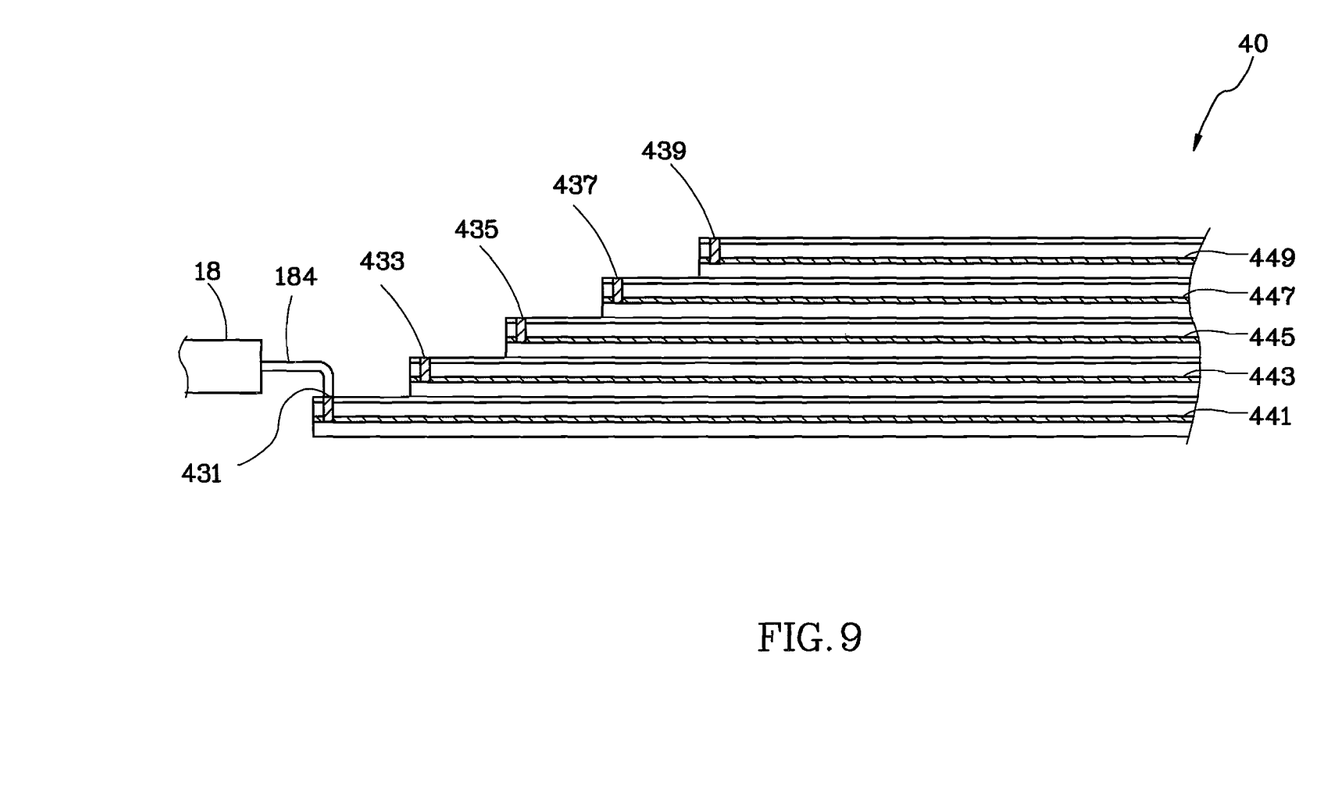
FIG. 9 is a schematic sectional view of a part of the signal path adjuster shown in FIG. 8.

Referring to FIGS. 8 and 9, a probe card 4 having a signal path adjustment function in accordance with a fourth embodiment of the present invention is disclosed. Similar to the aforesaid first embodiment, the probe card 4 of this fourth embodiment uses the same circuit board 10 and the same probe set 20, and the transmission lines 18 and the probes 24 used in this fourth embodiment provide a coaxial transmission functional structure; however, the signal path adjuster, denoted by reference numeral 40, in this fourth embodiment is provided with lead wires that can be selectively used to built up various lengths of path lengths for facilitating the adjustment of the signal paths thereon.

As illustrated, the signal path adjuster 40 comprises a plurality of adapter boards 401, 403, 405, 407 and 409 stacked up layer by layer in a stepped configuration. Each adapter board 401, 403, 405, 407 or 409 has parallel lead wires 421, 423, 425, 427 or 429 laid out thereon, and grounding plane 441, 443, 445, 447 or 449 embedded inside the body thereof and spaced below the lead wires 421, 423, 425, 427 or 429 in a parallel manner at a fixed pitch. The lead wires 421, 423, 425, 427 and 429 have lengths varying layer by layer. Taking the topmost adapter board 409 as an example, the lead wires 429 is arranged on the top surface of the body of the adapter board 409, and the grounding plane 449 is embedded inside the body of the adapter board 409. When the adapter board 409 and the adjacent lower adapter board 407 are stacked up, the grounding plane 449 of the adapter board 409 is not kept in contact with the lead wires 427 of the adjacent lower adapter board 407, avoiding short circuits. The other layers of adapter boards are stacked up in the same manner. Each adapter board 401, 403, 405, 407 or 409 of the signal path adjuster 40 further comprises first connection portions 411, 413, 415, 417 or 419 respectively located adjacent to two lateral sides 40a, 40b of the signal path adjuster 40, and second connection portions 431, 433, 435, 437 or 439 respectively located adjacent to two lateral sides 40a, 40b of the signal path adjuster 40 and spacedly and alternately arranged relative to first connection portions 411, 413, 415, 417 or 419. The first connection portions 411, 413, 415, 417 or 419 are formed of exposed two ends of the lead wires 421, 423, 425, 427 or 429 and electrically connected with the cores 182 of the transmission lines 18 and the cores 242 of the probes 24 if they are selected. The second connection portions 431, 433, 435, 437 or 439 partially penetrate the body of the respective adapter board 401, 403, 405, 407 or 409 to be electrically connected to the respective grounding plane 441, 443, 445, 447 or 449 and are electrically connected with the grounding wires 184 of the respective transmission lines 18 and the grounding wires 244 of the respective probes 24 if they are selected.

Thus, during the application of the aforesaid signal path adjustment method, the transmission lines 18 and the probes 24 are initially arranged at one same adapter board 401, 403, 405, 407 or 409, for example, the lowest adapter board 401 having the longest lead wires 421 of a same first length, which are served as the first lead wires, for synchronous transmission of high frequency signals. When it is necessary to change one first lead wire to a second lead wire subject to step h) of the aforesaid signal path adjustment method during transmission of either two high frequency signals through the signal path adjuster 40 due to a signal path difference resulting in asynchronous outputted high frequency signals, the corresponding transmission line 18 and probe 24 can be switchingly and electrically connected to the corresponding lead wire 423, 425, 427 or 429 and grounding plane 443, 445, 447 or 449 of another adapter board 403, 405, 407 or 409. In other words, in this case the lead wire 423 having a same second length, the lead wires 425 having a same third length, the lead wires 427 having a same fourth length, and the lead wires 429 having a same fifth length are served as the aforesaid second lead wires that can be selectively substituted for the first lead wire, i.e. the lead wires 421 for adjusting the signal paths.

Figure 10:
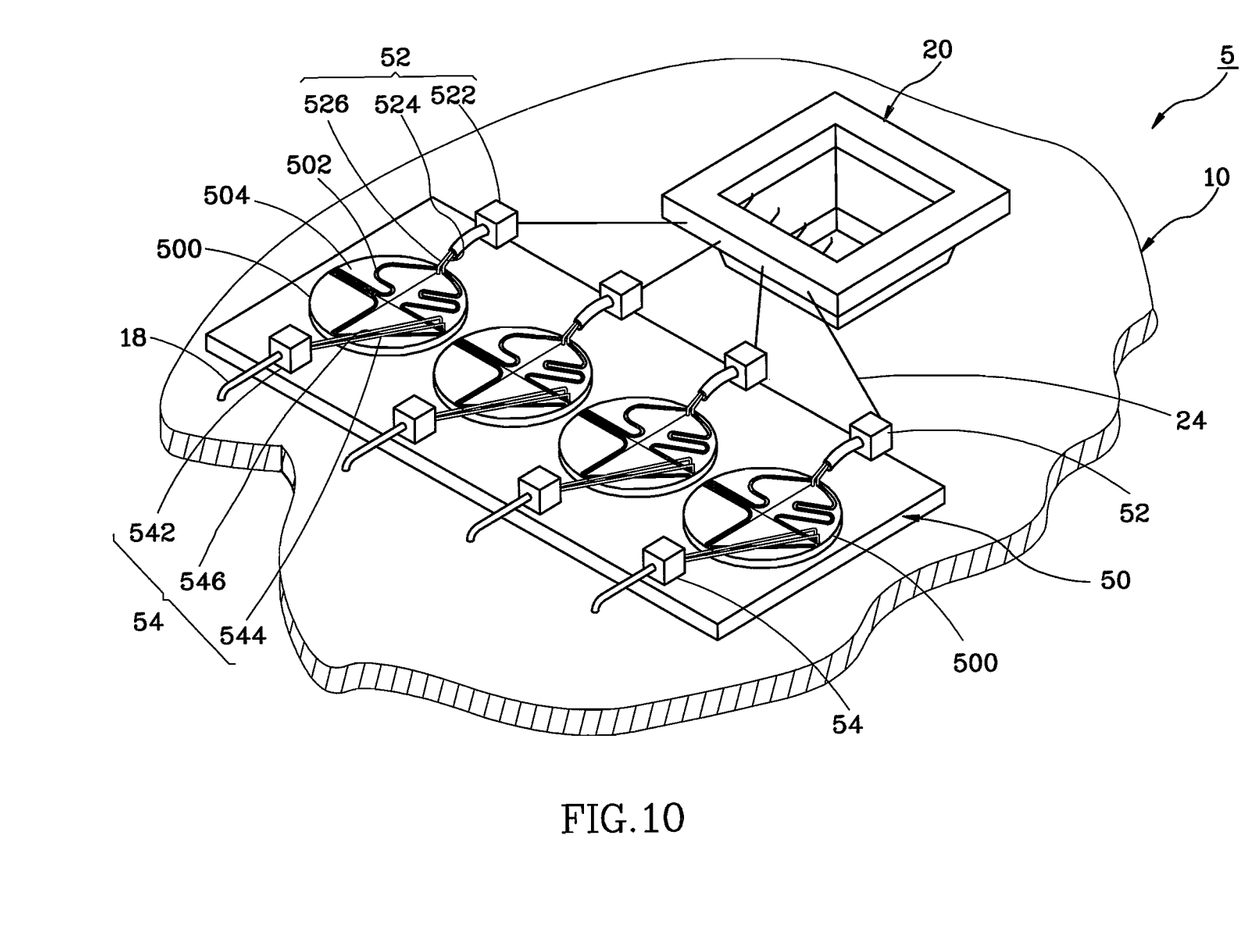
FIG. 10 is a perspective view of a part of a probe card in accordance with a fifth embodiment of the present invention, viewed from a bottom side of the probe card.

Referring to FIG. 10, a probe card 5 having a signal path adjustment function in accordance with a fifth embodiment of the present invention is disclosed. Similar to the aforesaid various embodiments, the probe card 5 of this fifth embodiment uses the same circuit board 10 and the same probe set 20, and the transmission lines 18 and the probes 24 used in this fifth embodiment provide a coaxial transmission functional structure; however, the signal path adjuster, denoted by reference numeral 50, in this fifth embodiment comprises a plurality of adapter boards 500 that allow adjustment of the lengths of high frequency signal paths individually.

The adapter boards 500 each are rotatable relative to one fixed reference point of the probe card 5 at a plurality of predetermined active angles. Each adaptor board 500 comprises a plurality of lead wires 502 having different lengths respectively disposed corresponding to the active angles and a grounding plane 504 disposed adjacent to and electrically isolated from each respective lead wire 502. Thus, when one adapter board 500 is rotated to one specific active angle, the two ends of the corresponding lead wire 502 are respectively electrically connected with one respective transmission line 18 of the circuit board 10 and one respective probe 24 of the probe set 20. The signal path adjuster 50 comprises pairs of fixed members 52, 54 arranged at two opposite sides relative to the adapter boards 500 and corresponding to the probes 24 and the transmission lines 18. Each fixed member 52, 54 comprises a connection portion 522, 542 disposed at one side, and a first extension portion 524, 544 and a second extension portion 526, 546 arranged in pair at an opposite side. The connection portions 522, 542 of the fixed members 52, 54 are respectively connected with the probes 24 and the transmission lines 18. The first extension portions 524, 544 of paired fixed members 52 and 54 are respectively electrically connected with the core of one transmission line 18 and the core of the associated probe 24 at the associated connection portions 522, 542. The second extension portions 526, 546 of the a paired fixed members 52, 54 are respectively electrically connected with the grounding wire of the aforesaid transmission line 18 and the grounding wire of the aforesaid probe 24 at the associated connection portions 522, 542. When one adapter board 500 is rotated to a specific active angle to have the two ends of one specific lead wire 502 be respectively kept in alignment with the first extension portions 524, 544 of one specific pair of opposite fixed members 52, 54, the first extension portions 524, 544 of this specific pair of opposite fixed members 52, 54 can touch the two ends of the aforesaid one specific lead wire 502, and the second extension portions 526, 546 of this specific pair of opposite fixed members 52, 54 can touch the grounding plane 504 of the aforesaid one adaptor board 500.

Thus, during the application of the aforesaid signal path adjustment method, the adapter boards 500 are respectively rotated to a predetermined active angle, such that the first extension portions 524, 544 of the pairs of fixed members 52, 54 can simultaneously and respectively touch the ends of the first lead wires 502 having a same first length of the adaptor boards 500, resulting in that the transmission lines 18 of the circuit board 10 and the probes 24 of the probe set 20 are respectively electrically connected with each others. When it is necessary to change one first lead wire to a second lead wire subject to step h) of the aforesaid signal path adjustment method during transmission of either two high frequency signals through the signal path adjuster 50 due to a signal path difference resulting in asynchronous outputted high frequency signals, the respective adapter board 500 can be rotated to another active angle where the first extension portions 524, 544 of the pair of opposite fixed members 52, 54 that respectively touch the ends of another lead wire 502, a second lead wire, having a specific length are respectively connected with the transmission line 18 of the circuit board 10 and the probe 24 of the probe set 20 to change the length of the high frequency signal transmission path.

Figure 11:
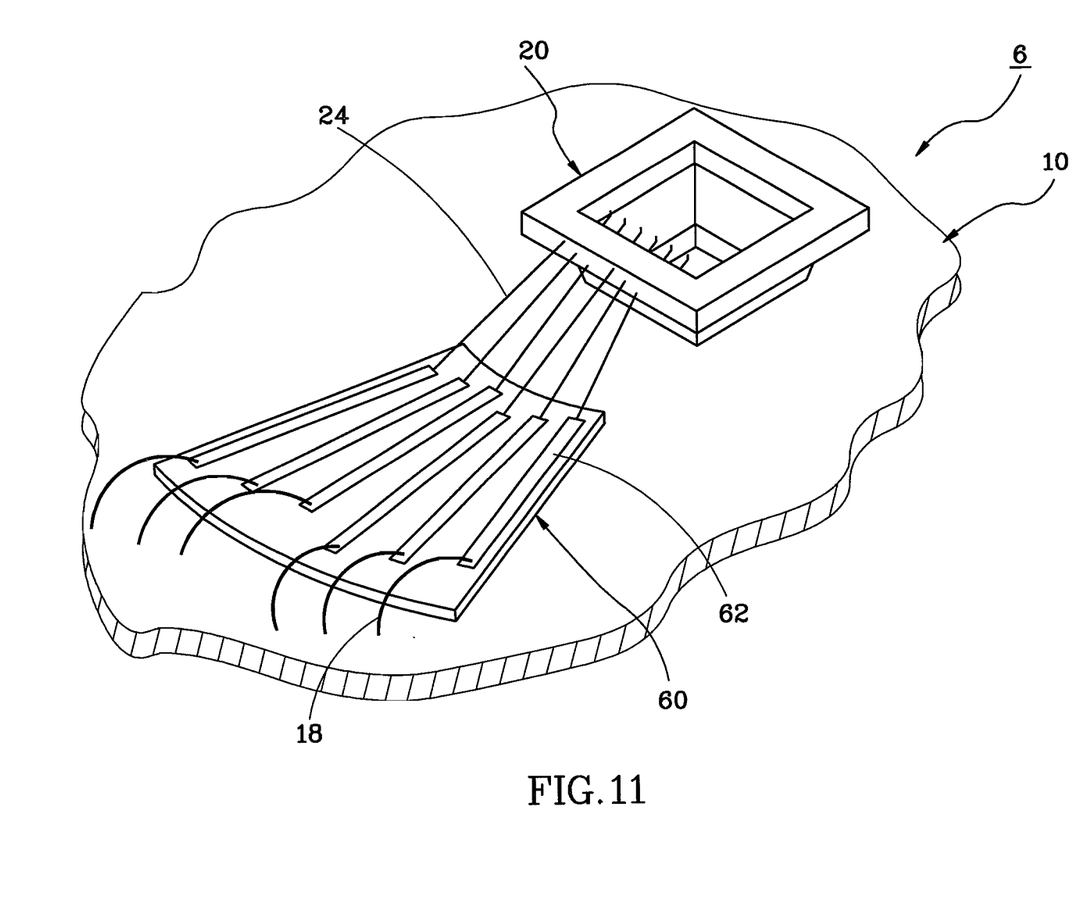
FIG. 11 is a perspective view of a part of a probe card in accordance with a sixth embodiment of the present invention, viewed from a bottom side of the probe card.

In the aforesaid embodiments, it is to adjust the length of every high frequency signal path in the probe card, keeping all the high frequency signals be transmitted synchronously, avoiding differences of output timings. FIG. 11 illustrates a probe card 6 having a signal path adjustment function in accordance with a sixth embodiment of the present invention. Similar to the aforesaid various embodiments, the probe card 6 of this sixth embodiment comprises a circuit board 10 with multiple transmission lines 18 and a probe set 20 with multiple probes 24; however, the probe card 6 further comprises an adapter board 60 having a plurality of lead wires 62 arranged thereon, wherein each lead wire 62 has its one end connected with one respective transmission line 18 and its other end connected with one respective probe 24.

The main feature of this sixth embodiment lies in that in the probe card 6, the transmission lines 18 are equal in length; the probes 24 are equal in length; the lead wires 62 are equal in length; the transmission lines 18, the probes 24 and the lead wires 62 have impedance matching characteristics. However, because every transmission line 18 or every probe 24 are provided at different locations, the wiring locations of the lead wires 62 of the adapter board 60 must be calculated in advance and then be laid out subject to the calculation. In the aforesaid various other embodiments, it needs not to consider whether or not every transmission line or probe has the same length during installation; by means of lead wire substitute, all signal transmission paths can be adjusted to become equal.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A probe card for high frequency signal transmission, comprising:
   a circuit board on which a plurality of transmission lines are arranged;
   a probe set having a plurality of probes; and
   a signal path adjuster having a plurality of lead wires each having two ends, the lead wires comprising first lead wires having a same first length and second lead wires each having a length different from that of the first lead wires;
   wherein the two ends of at least one of said first lead wires are electrically connected with one said transmission line and one said probe respectively, and the two ends of at least one of said second lead wires are electrically connected with another said transmission line and another said probe respectively, such that a first high frequency signal transmitting from the one said transmission line through the associated first lead wire to the associated probe and a second high frequency signal transmitting from the another said transmission line through the associated second lead wire to the associated probe have a same output timing when the first and second high frequency signals are synchronously inputted into the circuit board.

2. The probe card as claimed in claim 1, wherein the signal path adjuster comprises a plurality of adapter boards stacked layer by layer and provided with said lead wires having lengths varying from layer to layer; wherein the two ends of said lead wires are arranged adjacent to two lateral sides of the stacked adaptor boards of the signal path adjuster respectively for being electrically connected between the transmission lines and the probes.

3. The probe card as claimed in claim 2, wherein at least one of the two lateral sides of the stacked adaptor boards of the signal path adjuster is configured having a stepped shape and the ends of the lead wires, which are arranged adjacent to the stepped lateral side of the stacked adaptor boards, are exposed outside for electrical connection.

4. The probe card as claimed in claim 2, wherein both of the two lateral sides of the stacked adaptor boards of the signal path adjuster are configured having a stepped shape and the two ends of the lead wires are exposed outside for electrical connection.

5. The probe card as claimed in claim 4, wherein each said adaptor board comprises a plurality of said lead wires, an inside grounding plane arranged in parallel to said lead wires, a plurality of first connection portions formed of the two ends of said lead wires, and a plurality of second connection portions spacedly and alternately arranged relative to the first connection portions and partially penetrating a body of said adaptor board to be electrically connected with the grounding plane; each said transmission line and each said probe have a core for electrically connecting the first connection portion, and a grounding wire for electrically connecting the second connection portion.

6. The probe card as claimed in claim 1, wherein the signal path adjuster comprises a plurality of adaptor boards each having one said first lead wire and at least one said second lead wire; the two ends of said first lead wire or said second lead wire of one said adaptor board are electrically connected with one said transmission line and one said probe respectively.

7. The probe card as claimed in claim 6, wherein the signal path adjuster is provided around each said adaptor board with paired two fixed members each having a connection portion and an extension portion; the connection portions of each said paired two fixed members are electrically connected with one said transmission line and one said probe respectively, and the extension portions of each said paired two said fixed members are electrically connected with the two ends of said first lead wire or said second lead wire of one said adaptor board.

8. The probe card as claimed in claim 6, wherein each said adaptor board comprises a grounding plane adjacent to and electrically insulated from said lead wires of said adaptor board; the signal path adjuster is provided around each said adaptor board with paired two fixed members each having a pair of first and second extension portions electrically respectively connected with one said lead wire and the grounding plane of one said adaptor board; each said transmission line and each said probe have a core electrically connected with one said first extension portion of the paired two fixed members, and a grounding wire electrically connected with one said second connection portion of the paired two fixed members.

9. The probe card as claimed in claim 8, wherein each said adapter board is rotatable relative to a fixed reference point of the probe card at a plurality of predetermined active angles corresponding to said lead wires having different lengths.

* * * * *